(12) United States Patent
Rao et al.

(10) Patent No.: US 12,133,376 B2
(45) Date of Patent: Oct. 29, 2024

(54) METHOD FOR MANUFACTURING SEMICONDUCTOR STRUCTURE

(71) Applicant: CHANGXIN MEMORY TECHNOLOGIES, INC., Hefei (CN)

(72) Inventors: Fan Rao, Hefei (CN); Seongjin Kong, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 485 days.

(21) Appl. No.: 17/506,833

(22) Filed: Oct. 21, 2021

(65) Prior Publication Data

US 2022/0320111 A1 Oct. 6, 2022

Related U.S. Application Data

(63) Continuation of application No. PCT/CN2021/111894, filed on Aug. 10, 2021.

(30) Foreign Application Priority Data

Mar. 30, 2021 (CN) .......................... 202110340176.1

(51) Int. Cl.
*H10B 12/00* (2023.01)
*H01L 21/308* (2006.01)
*H01L 21/311* (2006.01)

(52) U.S. Cl.
CPC ....... *H10B 12/485* (2023.02); *H01L 21/3086* (2013.01); *H01L 21/31111* (2013.01)

(58) Field of Classification Search
CPC .............. H10B 12/485; H01L 21/3086; H01L 21/31111
See application file for complete search history.

(56) References Cited

U.S. PATENT DOCUMENTS 8,487,369 B2 7/2013 Kim
2008/0079089 A1* 4/2008 Lee .................. H01L 29/66515
257/E21.409
(Continued)

FOREIGN PATENT DOCUMENTS

CN 106611699 A 5/2017
CN 110957320 A 4/2020
(Continued)

*Primary Examiner* — Jay C Chang
*Assistant Examiner* — Mikka Liu
(74) *Attorney, Agent, or Firm* — Kilpatrick Townsend & Stockton LLP

(57) ABSTRACT

A method for manufacturing a semiconductor structure is provided. The method for manufacturing the semiconductor structure includes: providing a substrate, in which the substrate includes a plurality of active areas separated from each other, the active areas extend along a first direction, and each active area includes a bit line contact area and two electrical connection areas located on both sides of the bit line contact area; forming first mask layers, which are separated from each other, on the substrate; forming spacer layers on two opposite side walls of each first mask layer; forming second mask layers between adjacent first mask layers; removing the spacer layers between the first mask layers and the second mask layers; and etching the substrate by using the first mask layers and the second mask layers as masks to form a bit line contact hole.

20 Claims, 11 Drawing Sheets

(56) References Cited

U.S. PATENT DOCUMENTS

| | | | |
|---|---|---|---|
| 2011/0101450 A1 | 5/2011 | Kim | |
| 2011/0256678 A1* | 10/2011 | Kim | H01L 21/76897 |
| | | | 438/239 |
| 2014/0159148 A1* | 6/2014 | Chung | H10B 12/053 |
| | | | 257/330 |
| 2020/0176455 A1 | 6/2020 | Kim et al. | |

FOREIGN PATENT DOCUMENTS

| | | |
|---|---|---|
| CN | 111640743 A | 9/2020 |
| CN | 111834214 A | 10/2020 |
| CN | 111863815 A | 10/2020 |
| CN | 112017951 A | 12/2020 |

\* cited by examiner

METHOD FOR MANUFACTURING SEMICONDUCTOR STRUCTURE

CROSS-REFERENCE TO RELATED APPLICATIONS

This is a continuation application of International Patent Application No. PCT/CN2021/111894, filed on Aug. 10, 2021, which claims priority to Chinese Patent Application No. 202110340176.1, filed on Mar. 30, 2021 and entitled "METHOD FOR MANUFACTURING SEMICONDUCTOR STRUCTURE". The disclosures of International Patent Application No. PCT/CN2021/111894 and Chinese Patent Application No. 202110340176.1 are incorporated by reference herein in their entireties.

TECHNICAL FIELD

An embodiment of the disclosure relates, but is not limited, to a method for manufacturing a semiconductor structure.

BACKGROUND

A Dynamic Random Access Memory (DRAM) in a semiconductor structure is a type of semiconductor memory widely used in computer systems. The main principle of the DRAM is to represent whether a binary bit is 1 or 0 by using the amount of charge stored in a capacitor.

In order to improve the integration of a semiconductor integrated circuit, the feature size of the DRAM is becoming smaller and smaller. However, the manufacturing process of the DRAM is becoming more and more difficult due to the continuous reduction of the feature size of the DRAM, and the performance of the DRAM needs to be further improved.

SUMMARY

An embodiment of the disclosure provides a method for manufacturing a semiconductor structure, which includes the following operations. A substrate is provided, in which the substrate includes a plurality of active areas separated from each other, the active areas extend along a first direction, and each active area includes a bit line contact area and two electrical connection areas located on both sides of the bit line contact area. First mask layers which are separated from each other are formed on the substrate, in which each first mask layer extends along a second direction and spans the plurality of active areas, the second direction is different from the first direction, and one of the two electrical connection areas of each active area directly faces a respective one of the first mask layers. Spacer layers are formed on two opposite side walls of each first mask layer, in which each spacer layer extends along the second direction and spans the plurality of active areas, and each bit line contact area directly faces a respective one of the spacer layers. Second mask layers are formed between adjacent first mask layers, in which the second mask layers cover side walls of the spacer layers, each second mask layer spans the plurality of active areas, and the other one of the two electrical connection areas of each active area directly faces a respective one of the second mask layers. The spacer layers between the first mask layers and the second mask layers are removed. The substrate is etched by using the first mask layers and the second mask layers as masks to form a bit line contact hole.

BRIEF DESCRIPTION OF THE DRAWINGS

One or more embodiments are exemplarily explained through the figures in the accompanying drawings corresponding thereto, these exemplary explanations do not constitute a limitation to the embodiments, elements having same reference numerals in the accompanying drawings are denoted as similar elements; and unless otherwise specifically declared, the figures in the accompanying drawings do not constitute a limitation of proportion.

DETAILED DESCRIPTION

Figure 1:
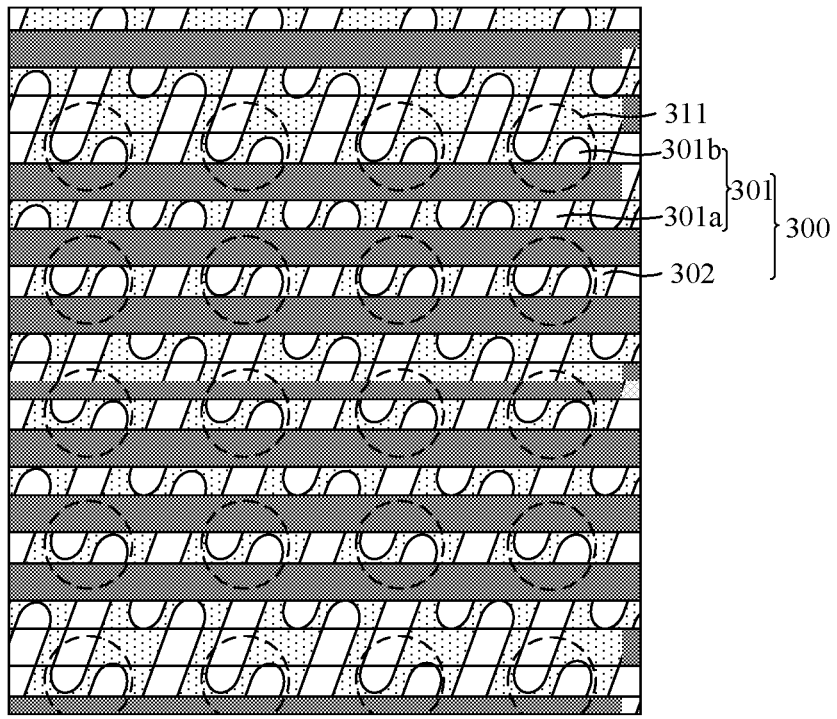
FIG. 1-FIG. 3 are schematic diagrams showing structures corresponding to various operations in a method for manufacturing a semiconductor structure according to an embodiment of the disclosure.
Figure 2:
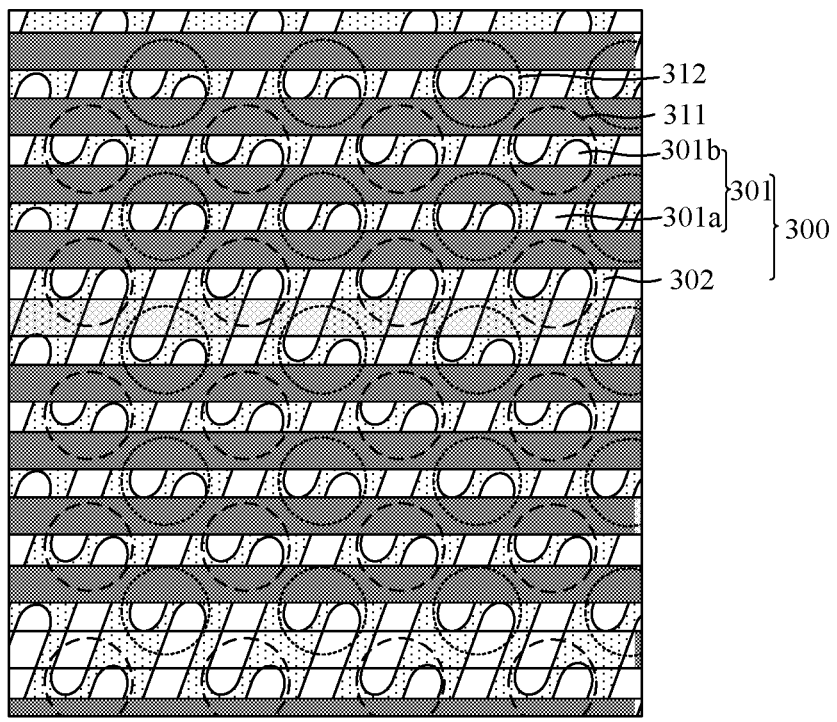
Figure 3:
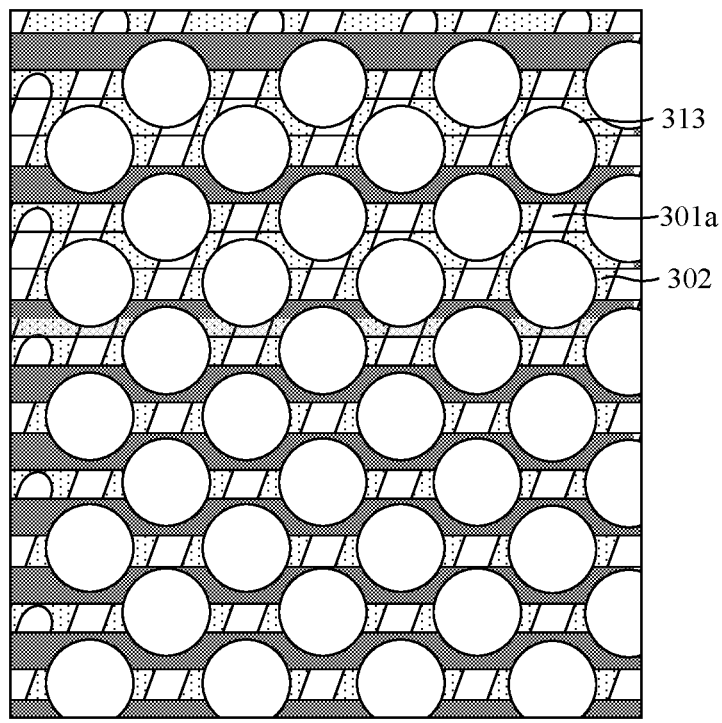

According to the Background, the manufacturing process of the DRAM is becoming more and more difficult, and the performance of the DRAM needs to be further improved. At present, a bit line contact hole is generally formed by using a method for manufacturing a semiconductor structure shown in FIG. 1-FIG. 3. Referring to FIG. 1-FIG. 3, a substrate 300 includes an active area 301 and an isolation structure 302. The active area 301 includes a bit line contact area 301a and two electrical connection areas 301b located on both sides of the bit line contact area 301a. The bit line contact area 301a is adapted to form the bit line contact hole.

Referring to FIG. 1, after a lower mask layer, an upper mask layer and a first photoresist layer stacked onto one another are formed on the substrate 300, the first photoresist layer is exposed and developed, so as to form a first development area 311. The first development area 311 corresponds to the electrical connection areas 301b of two adjacent active areas 301. After the first development area 311 is formed, the upper mask layer is etched by using the first photoresist layer as a mask.

Referring to FIG. 2, a top mask layer and a second photoresist layer stacked onto one another are formed on the upper mask layer. The second photoresist layer is exposed and developed, so as to form a second development area 312. The second development area 312 corresponds to the electrical connection areas 301b of the other two adjacent active areas 301. The top mask layer is etched by using the second photoresist layer as a mask, so as to form a patterned top mask layer. The upper mask layer is etched by using the patterned top mask layer as a mask. In this case, the upper mask layer is provided with a patterned area directly facing the first development area 311 and the second development area 312.

Referring to FIG. 3, circular mask layers 313 are formed in the patterned area, and the circular mask layers 313 directly face all the electrical connection areas 301b of the active areas 301. After the circular mask layers 313 are formed, the upper mask layer is removed. The lower mask layer is etched by using the circular mask layers 313 as masks, so that the bit line contact area 301a of each active area 301 is exposed by the patterned lower mask layer. The substrate is etched by using the patterned lower mask layer as a mask, so as to form the bit line contact hole.

As can be seen from the above analysis, a plurality of circular mask layers may be generally formed when the bit line contact holes are formed. These dotted mask layers have a large number of smaller spacing. Since it is difficult to form a mask layer with a larger density in one photolithographic operation, it is necessary to add one more photolithographic operation to reduce the process difficulty. However, since there is a certain error during the alignment of the photolithography masks, the circular mask layers are easily dislocated due to the increase in the number of photolithographic operations, so that the bit line contact holes finally formed cannot be symmetric with each other, thereby affecting the performance of the semiconductor structure.

In order to solve the above problem, an embodiment of the disclosure provides a method for manufacturing a semiconductor structure. The method for manufacturing the semiconductor structure includes the following operations. First mask layers extending along a second direction are formed on a substrate, in which a respective one of the first mask layers directly faces one of the two electrical connection areas of each active area. Spacer layers are formed on side walls of each first mask layer, in which a respective one of the spacer layers directly faces each bit line contact area of each active area. Second mask layers are formed between adjacent first mask layers, in which a respective one of the second mask layers directly faces the other one of the two electrical connection areas of each active area. After the spacer layers are removed, the substrate is etched by using the first mask layers and the second mask layers as masks, so as to form a bit line contact hole. Since it is only necessary to adopt the photolithographic operation when the first mask layers are formed, the number of the photolithographic operations may be reduced, and the production process may be simplified. Further, the risk of alignment errors may be reduced, so that the bit line contact holes symmetric with each other are formed, thereby improving the performance of the semiconductor structure.

Hereinafter, the respective embodiments of the disclosure will be described in detail in connection with the accompanying drawings. However, those ordinary skilled in the art may understand that, in the respective embodiments of the disclosure, numerous technical details are set forth in order to provide a reader with a better understanding of the disclosure. However, the technical solutions claimed in the disclosure can also be implemented without these technical details and various changes and modifications based on the respective embodiments below.

Figure 4:
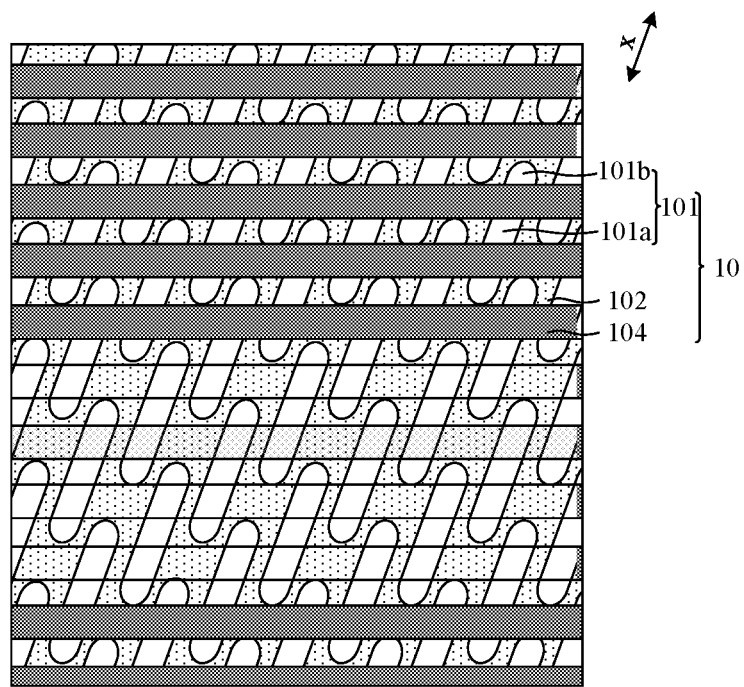
FIG. 4-FIG. 21 are schematic diagrams showing structures corresponding to various operations in a method for manufacturing a semiconductor structure according to an embodiment of the disclosure.

Referring to FIG. 4, FIG. 4 is a top view of a semiconductor structure. A substrate 10 is provided. The substrate 10 includes a plurality of active areas 101 separated from each other. The active areas 101 extend along a first direction X. Each active area 101 includes a bit line contact area 101a and two electrical connection areas 101b located on both sides of the bit line contact area 101a.

The bit line contact area 101a is adapted to form a bit line contact hole, which is configured for subsequently electrically connecting to a bit line. The electrical connection areas 101b may be capacitor contact areas, which are configured for subsequently electrically connecting to capacitors.

The material of each active area 101 may be monocrystalline silicon containing doped ions, such as boron or phosphorus.

The substrate 10 further includes an isolation structure 102 for isolating two adjacent active areas 101 from each other. The material of the isolation structure 102 is an insulating material, such as silicon dioxide, silicon carbide, or silicon nitride.

The substrate 10 also includes a buried word line, and a word line covering layer 104 on the buried word line. The material of the buried word line may be a metal, such as tungsten, molybdenum, or tantalum. The material of the word line covering layer 104 may be an insulating material, such as silicon dioxide, silicon carbide, or silicon nitride.

Figure 5:
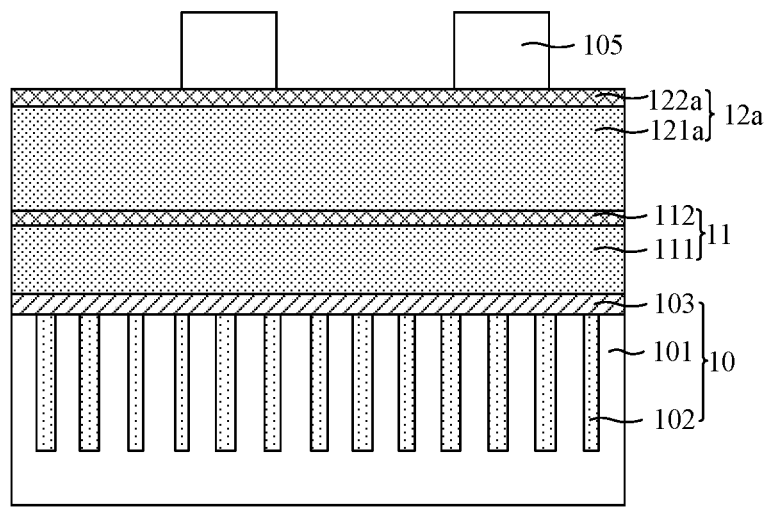

Referring to FIG. 5, the substrate 10 may further include an insulating layer 103 covering a surface of the active area 101 and a surface of the isolation structure 102. The insulating layer 103 may be in the form of a double-layer structure, such as a laminated structure of silicon nitride and silicon oxide.

Figure 6:
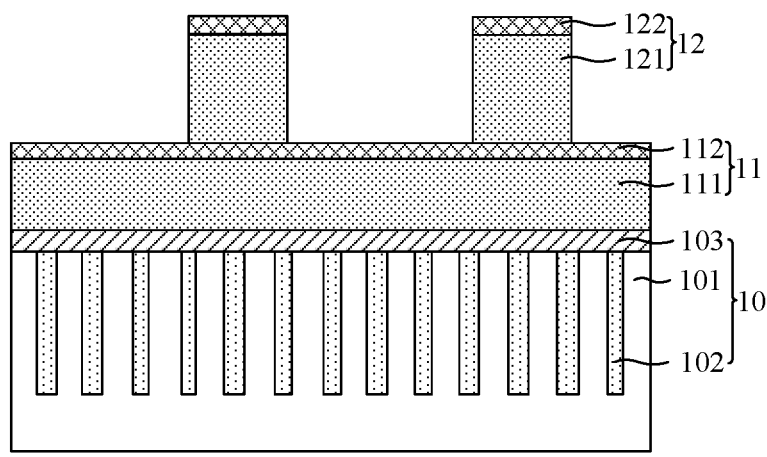

Referring to FIG. 5-FIG. 8, FIG. 7 and FIG. 8 are top views of FIG. 6. First mask layers 12 separated from each other are formed on the substrate 10. Each first mask layer 12 extends along a second direction Y and spans the plurality of active areas 101. The second direction Y is different from the first direction X. One of the two electrical connection areas of each active area 101 directly faces a respective one of the first mask layers 12.

Referring to FIG. 5, an initial first mask layer 12a is formed on the substrate 10. The initial first mask layer 12a includes an initial first lower mask layer 121a and an initial first upper mask layer 122a stacked onto one another. The initial first mask layer 12a in the form of a double-layer structure may improve the accuracy of subsequent etching.

A patterned photoresist layer 105 is formed on the initial first mask layer 12a. The initial first mask layer 12a is coated with a photoresist material once, and the photoresist material is exposed after alignment. The exposed photoresist material is baked and developed, so as to finally form the patterned photoresist layer 105. The patterned photoresist layer 105 directly faces the respective electrical connection areas 101b of the active areas 101.

In the embodiment of the disclosure, only one photolithographic operation is needed, so that the manufacturing process is relatively simple. In addition, compared with multiple photolithographic operations, alignment error caused by a single photolithographic operation is less, which is beneficial to improve the performance of the semiconductor structure.

Referring to FIG. 6, the initial first mask layer 12a is etched by using the patterned photoresist layer 105 (referring to FIG. 5) as a mask, so as to form the first mask layers 12 in the form of a double-layer structure. Each first mask layer 12 includes a first lower layer structure 121 and a first upper layer structure 122 stacked onto one another. The hardness of the first upper layer structure 122 is greater than the hardness of the first lower layer structure 121. Therefore, it is beneficial to improve the accuracy of the etched pattern.

In the embodiment of the disclosure, the material of the first upper layer structure 122 is silicon nitride. In other embodiments, the material of the first upper layer structure may also be silicon oxynitride.

In the embodiment of the disclosure, the first lower layer structure 121 is a spin-on hard mask layer, such as silicon carbide or silicon oxycarbide. In other embodiments, the first lower layer structure may also be silicon oxide.

In the embodiment of the disclosure, before forming the first mask layers 12, the method for manufacturing the semiconductor structure further includes the following operation. A bottom mask layer 11 covering the substrate 10 is formed. The first mask layers 12 are also arranged on the bottom mask layer 11. The bottom mask layer 11 may improve the accuracy of pattern transfer. The bottom mask layer 11 includes a first bottom mask layer 111 and a second bottom mask layer 112 stacked onto one another. The hardness of the second bottom mask layer 112 is larger than the hardness of the first bottom mask layer 111. In the embodiment of the disclosure, the material of the second bottom mask layer 112 may be silicon nitride, and the material of the first bottom mask layer 111 may be silicon carbide. In other embodiments, the bottom mask layer covering the substrate may also not be formed.

Figure 7:
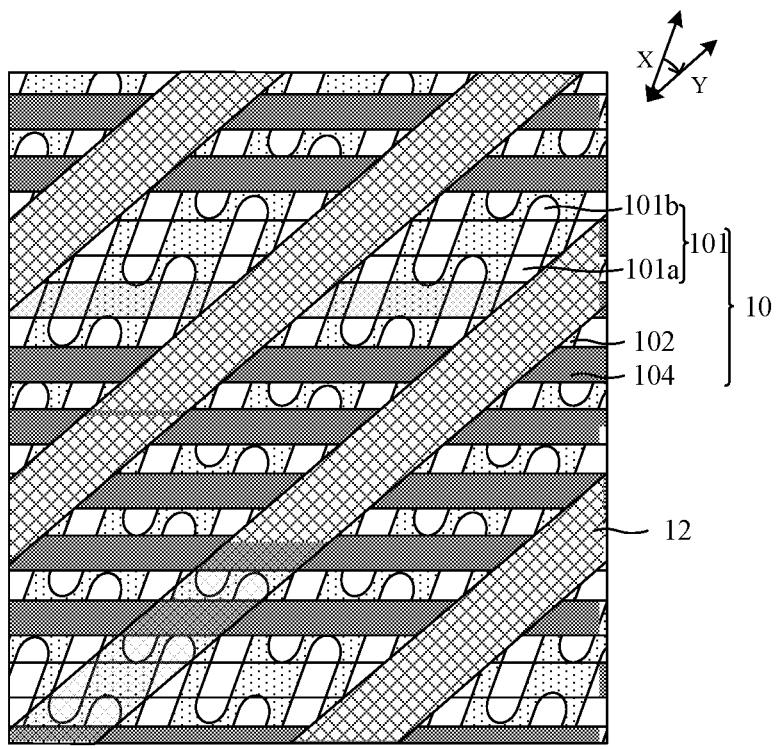

Referring to FIG. 7, each first mask layer 12 is in the form of a strip-shaped structure, and each first mask layer 12 spans the plurality of active areas 101. Compared with a dot-shaped structure with larger density, the manufacturing difficulty of the first mask layer 12 in the form of a strip-shaped structure is less, and the production efficiency is higher.

In some embodiments, each first mask layer 12 is located directly above the respective electrical connection area 101b of each active area 101. For each active area 101, there is one and only one electrical connection area 101b covered by the first mask layer 12. A second mask layer may be subsequently formed to cover the other electrical connection area 101b of each active area 101. The bit line contact area 101a between the two electrical connection areas 101b is exposed by the first mask layer 12 and the second mask layer, so as to form a bit line contact hole.

In the embodiment of the disclosure, the extending direction of each first mask layer 12 is the second direction Y, and the extending direction of each active area 101 is the first direction X. An angle between the first direction X and the second direction Y in a clockwise direction is an acute angle. In other words, the angle of rotation of the first direction X towards the second direction Y in the clockwise direction is an acute angle. In some embodiments, the angle between the first direction X and the second direction Y in the clockwise direction is comprised between 35 degrees and 45 degrees, for example, 36 degrees, 38 degrees, or 40 degrees.

Figure 8:
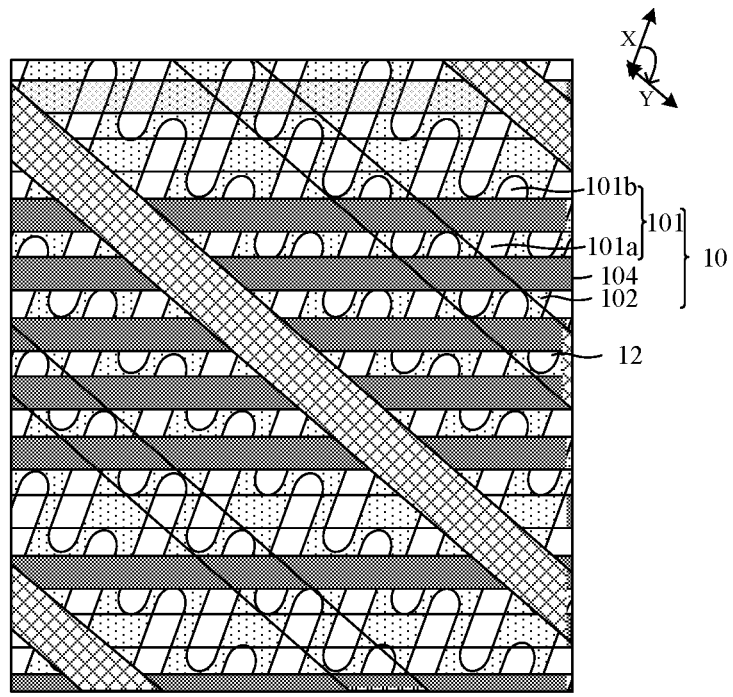

In other embodiments, referring to FIG. 8, the angle between the first direction X and the second direction Y in the clockwise direction is an obtuse angle. In other words, the angle of rotation of the first direction X toward the second direction Y in the clockwise direction is an obtuse angle. In some embodiments, the angle between the first direction X and the second direction Y in the clockwise direction is comprised between 135 degrees and 145 degrees, for example, 137 degrees, 138 degrees, or 140 degrees.

Figure 9:
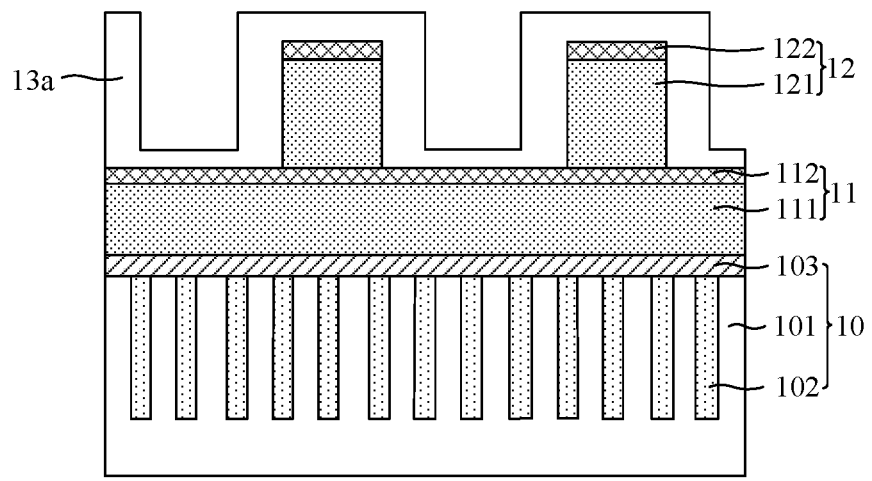
Figure 10:
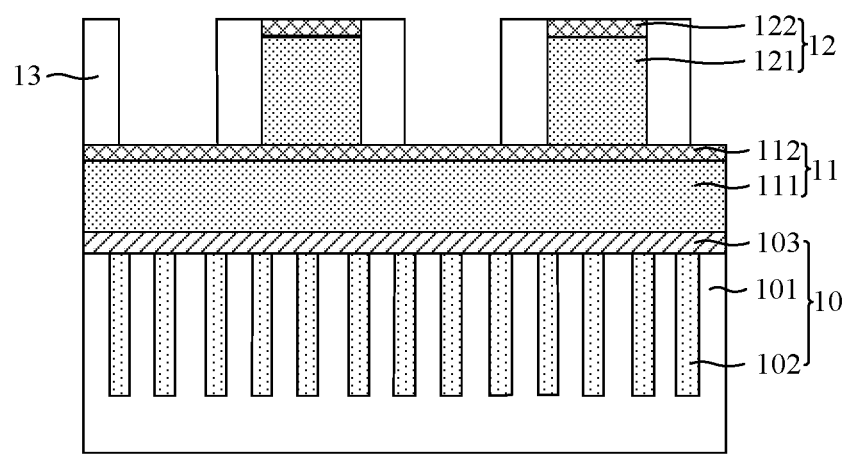
Figure 11:
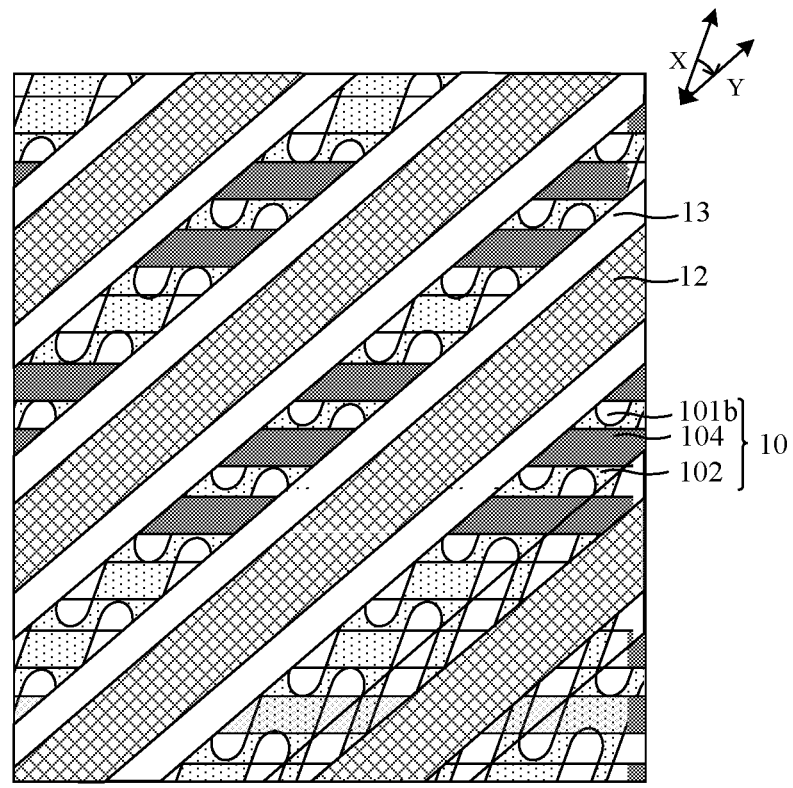

Referring to FIG. 9-FIG. 11, FIG. 11 is a top view of FIG. 10. Spacer layers 13 are formed on two opposite side walls of each first mask layer 12. Each spacer layer 13 extends along the second direction Y and spans the plurality of active areas 101. Each bit line contact area 101a directly faces a respective one of the spacer layers 13.

In the embodiment of the disclosure, before the second mask layers are formed, the spacer layers 13 are arranged on the side walls of the first mask layers 12. Referring to FIG. 9, the operation that the spacer layers 13 are formed includes the following operation. An initial spacer layer 13a for conformal coverage is formed. The initial spacer layer 13a is arranged on the surfaces of the first mask layers 12 and on a portion of the substrate 10 between two adjacent first mask layers 12.

The material of the initial spacer layer 13a is a hard mask material, such as silicon oxide.

In the embodiment of the disclosure, the initial spacer layer 13a is formed through a chemical vapor deposition process. In other embodiments, the initial spacer layer may be formed through an atomic layer deposition process.

Referring to FIG. 10, the initial spacer layer 13a (referring to FIG. 9) is etched, so as to reserve a portion of the initial spacer layer 13a arranged on the side walls of the first mask layers 12 to form the spacer layers 13. That is, a portion of the initial spacer layer 13a arranged on the top surfaces of the first mask layers 12 and a portion of the initial spacer layer 13a arranged between two adjacent first mask layers 12 are removed through etching. The second mask layers are subsequently formed between the adjacent spacer layers 13.

Referring to FIG. 11, the spacer layers 13 are located directly above the plurality of bit line contact areas 101a, and the bit line contact areas 101a of all the active areas 101 are covered by the spacer layers 13.

That is, in the embodiment of the disclosure, the spacer layers 13 are formed through a self-alignment double patterning process. With the self-alignment double patterning process, the production difficulty may be reduced, and alignment errors caused by the photolithographic operation may be avoided, thereby ensuring that the bit line contact holes finally formed may be symmetric with each other.

Figure 12:
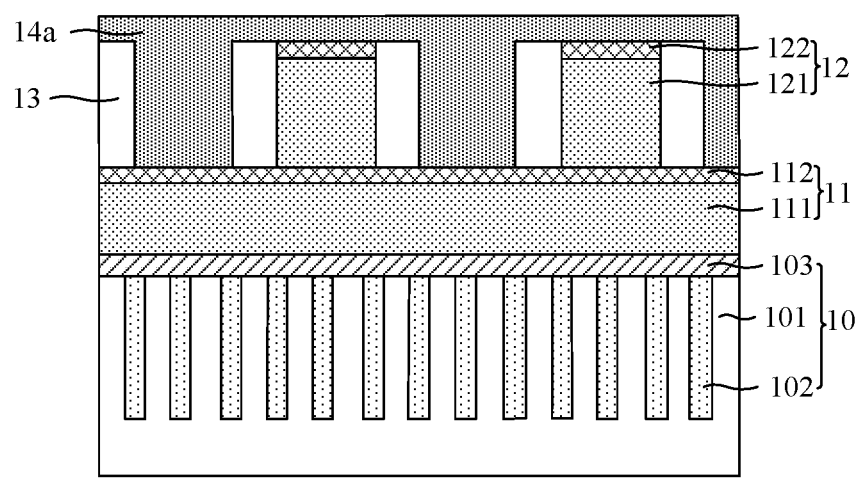
Figure 13:
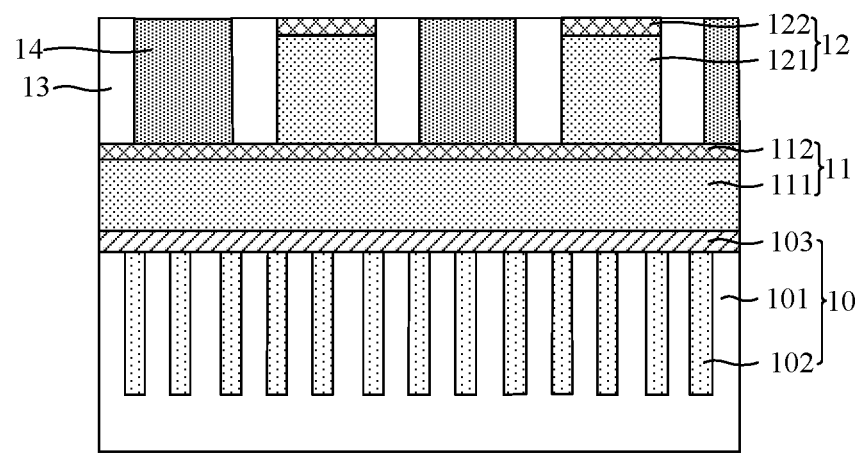
Figure 14:
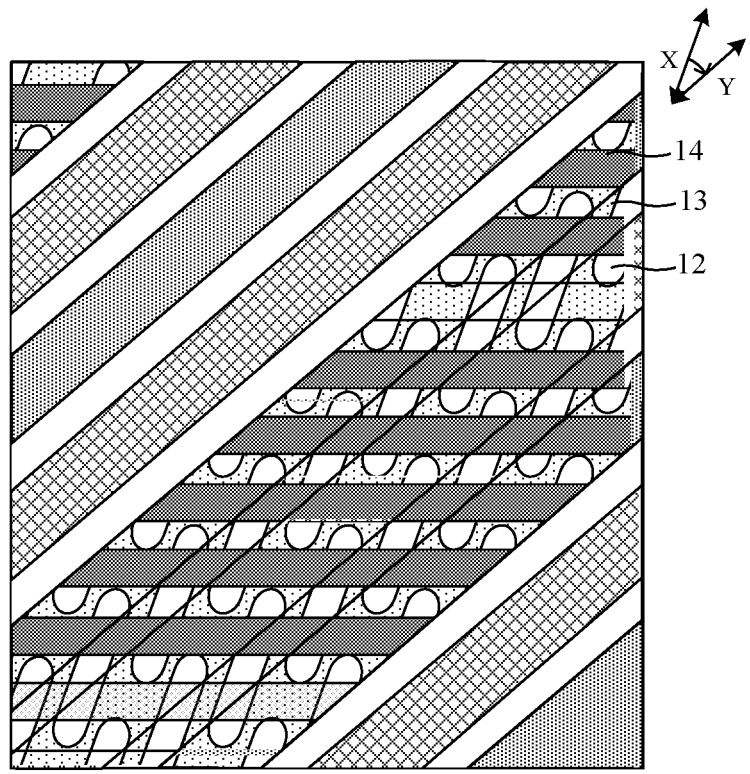

Referring to FIG. 12-FIG. 14, FIG. 14 is a top view of FIG. 13. The second mask layers 14 are formed between the adjacent first mask layers 12. The second mask layers 14 also cover the side walls of the spacer layers 13. Each second mask layer 14 spans the plurality of active areas 101, and the other one of the two electrical connection areas 101b (referring to FIG. 11) of each active area 101 directly faces a respective one of the second mask layers 14.

Referring to FIG. 12, the operation that the second mask layers 14 (referring to FIG. 13) are formed includes the following operation. An initial second mask layer 14a is formed. The initial second mask layer 14a is arranged between adjacent first mask layers 12, and also covers the side wall of each spacer layer 13 and a top surface of each spacer layer 13.

In the embodiment of the disclosure, the initial second mask layer 14a is formed through a chemical vapor deposition process. In other embodiments, the initial second mask layer may also be formed through a physical vapor deposition process.

Referring to FIG. 13, the initial second mask layer 14a (referring to FIG. 12) is performed a planarization treatment until the top surface of each spacer layer 13 is exposed, so as to form the second mask layers 14.

Referring to FIG. 14, the second mask layers 14 extend in the second direction Y and are parallel to the first mask layers 12. A respective one of the second mask layers 14 covers one of the two electrical connection areas 101b of each active area 101. For the two electrical connection areas 101b of each active area 101, one of the two electrical connection areas 101b is covered by a respective one of the second mask layers 14, and the other one of the two electrical connection areas 101b is covered by a respective one of the first mask layers 12.

The width of each first mask layer 12 is the same as the width of each second mask layer 14 in a direction perpendicular to the second direction Y. It can be understood that since the first mask layers 12 and the second mask layers 14 both cover the electrical connection areas 101b, the width of each first mask layer 12 is the same as the width of each second mask layer 14, so that it can be ensured that the bit line contact holes finally formed are symmetric with each other.

In the embodiment of the disclosure, each second mask layer 14 is in the form of a single-layer structure, and the material of the first lower layer structure 121 of each first mask layer 12 is the same as the material of the second mask layer 14. For example, the material of the second mask layer 14 may be silicon carbide. It should be noted that, the materials of the second mask layer 14 and the first mask layer 12 should be different from the material of the spacer layer 13, so as to ensure that the second mask layers 14 and the first mask layers 12 may not be removed when the spacer layers 13 are subsequently removed.

Figure 15:
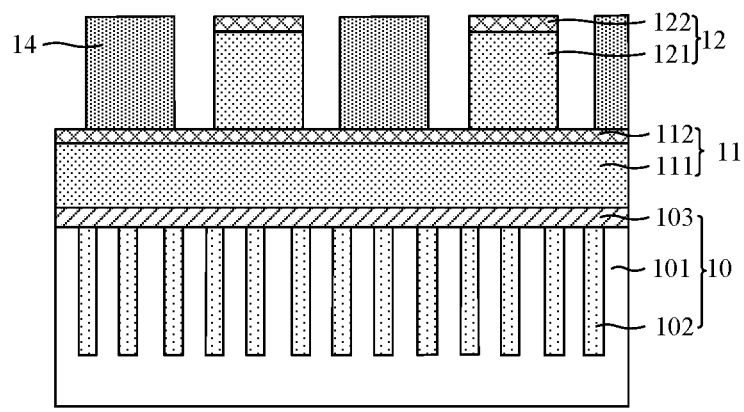
Figure 16:
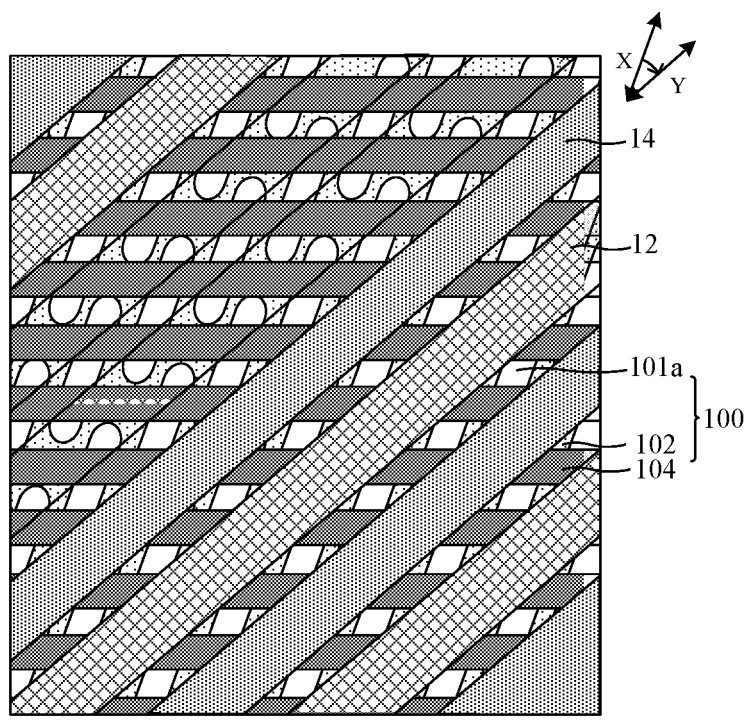

Referring to FIG. 15-FIG. 16, FIG. 16 is a top view of FIG. 15. The spacer layers 13 (referring to FIG. 13) between the first mask layers 12 and the second mask layers 14 are removed, so as to expose the bit line contact areas 101a of all the active areas 101.

In the embodiment of the disclosure, the spacer layers 13 between the first mask layers 12 and the second mask layers 14 are removed through a wet etching process. The wet etching process is relatively simple. In other embodiments, the spacer layers between the first mask layers and the second mask layers may also be removed through a dry etching process.

Figure 17:
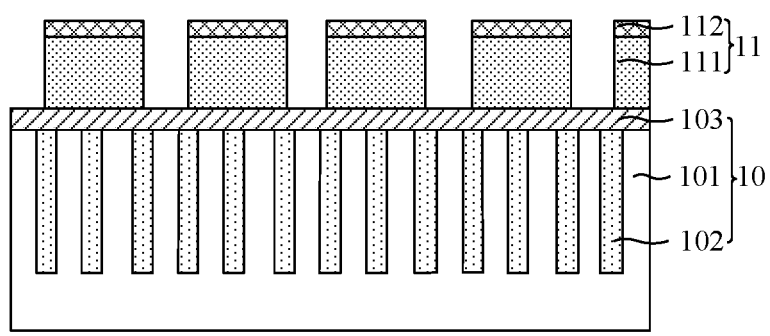
Figure 18:
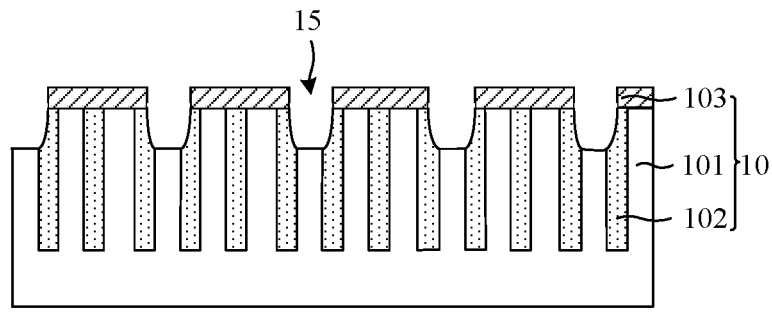

Referring to FIG. 17 and FIG. 18, the substrate 10 is etched by using the first mask layers 12 and the second mask layers 14 as masks, so as to form a bit line contact hole 15.

Referring to FIG. 17, the bottom mask layer 11 is etched by using the first mask layers (referring to FIG. 15) and the second mask layers 14 (referring to FIG. 15) as masks, so as to form a patterned bottom mask layer 11.

Referring to FIG. 18, the substrate 10 is etched by using the patterned bottom mask layer 11 as a mask, so as to form the bit line contact hole 15. The bottom mask layer 11 may improve the accuracy of pattern transfer.

Figure 19:
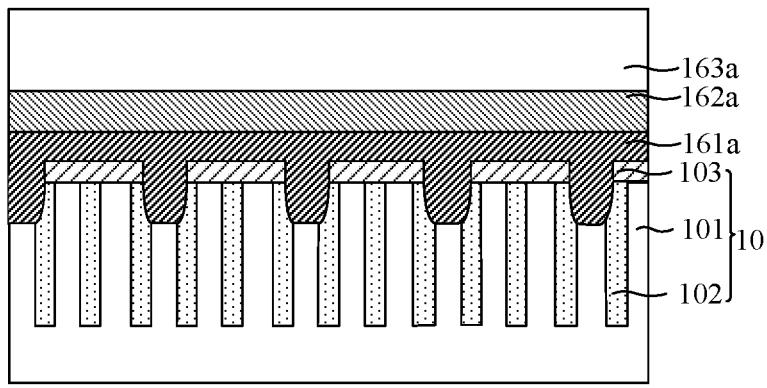
Figure 20:
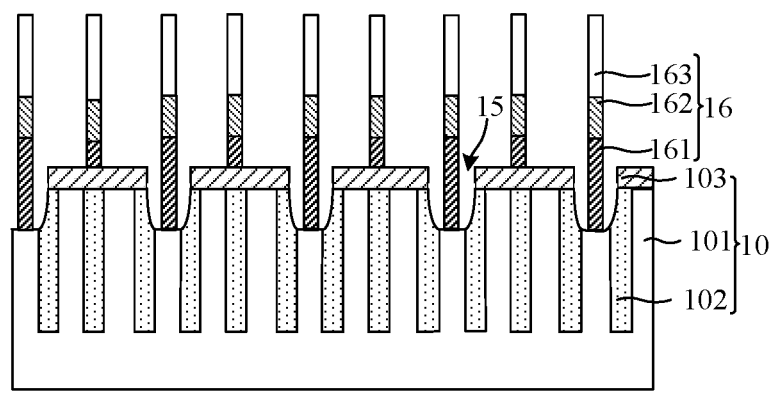
Figure 21:
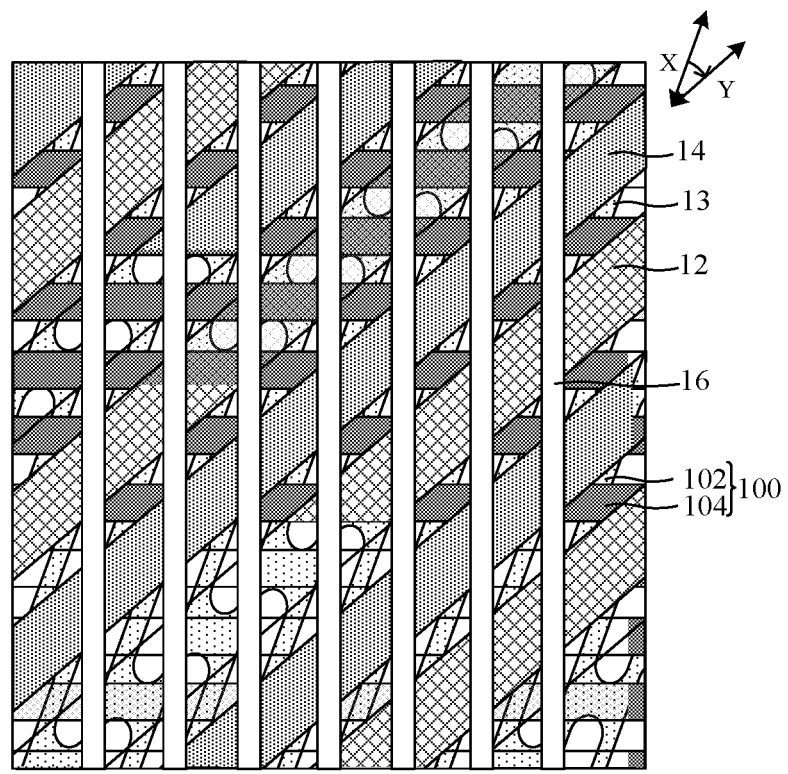

Referring to FIG. 19-FIG. 21, a bit line 16 filling the bit line contact hole 15 (referring to FIG. 18) is formed. The bit line 16 extends beyond a top surface of the substrate 10.

Referring to FIG. 19, an initial bit line contact layer 161a filling the bit line contact hole 15 is formed. The initial bit line contact layer 161a is also arranged on the substrate 10. And an initial bit line conductive layer 162a and an initial bit line covering layer 163a stacked onto one another are formed on the initial bit line contact layer 161a.

In the embodiment of the disclosure, the initial bit line contact layer 161a and the initial bit line covering layer 163a are formed through a chemical vapor deposition process, and the initial bit line conductive layer 162a is formed through a physical vapor deposition process.

The material of the initial bit line contact layer 161a is a conductive material, such as polycrystalline silicon. The material of the initial bit line conductive layer 162a is a low-resistance metal, such as tungsten or molybdenum. The material of the initial bit line covering layer 163a is an insulating material, such as silicon nitride or silicon oxide.

Referring to FIG. 20-FIG. 21, the initial bit line covering layer 163a (referring to FIG. 19), the initial bit line conductive layer 162a (referring to FIG. 19), and the initial bit line contact layer 161a (referring to FIG. 19) are performed a patterning treatment, so as to form a bit line contact layer 161, a bit line conductive layer 162 and a bit line covering layer 163. The bit line contact layer 161, the bit line conductive layer 162 and the bit line covering layer 163 form the bit line 16.

Strip-shaped mask layers are formed on the bit line covering layers 163, and the initial bit line covering layers 163a, the initial bit line conductive layers 162a and the initial bit line contact layers 161a are sequentially dry etched by using the strip-shaped mask layers as masks, so as to form bit line covering layers 163 separated from each other, bit line conductive layers 162 separated from each other, and bit line contact layers 161 separated from each other.

In the embodiment of the disclosure, the extending direction of the bit line 16 is different from the first direction X and the second direction Y, and is perpendicular to the extending direction of the word line covering layer 104.

Overall, in the embodiment of the disclosure, since it is only necessary to adopt the photolithographic operation when the first mask layers 12 are formed, the spacer layers 13 and the second mask layers 14 may be subsequently formed through a deposition process. Since the number of the photolithographic operations is fewer, the process difficulty may be reduced, and errors generated by alignment may be reduced. In addition, compared with a dot-shaped mask with larger density, the first mask layers 12 are in the form of strip-shaped structures, so that the etching difficulty may be reduced, and the accuracy of patterns may be improved.

Figure 22:
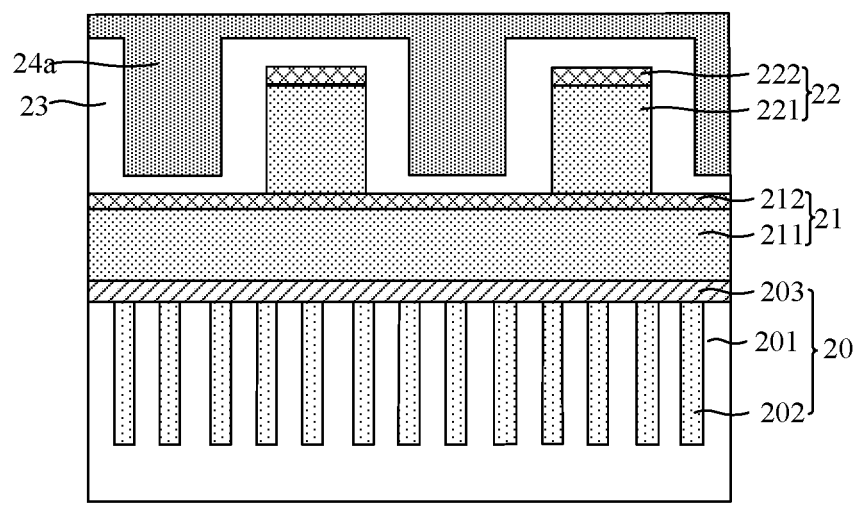
FIG. 22-FIG. 24 are schematic diagrams showing structures corresponding to various operations in a method for manufacturing a semiconductor structure according to another embodiment of the disclosure.
Figure 23:
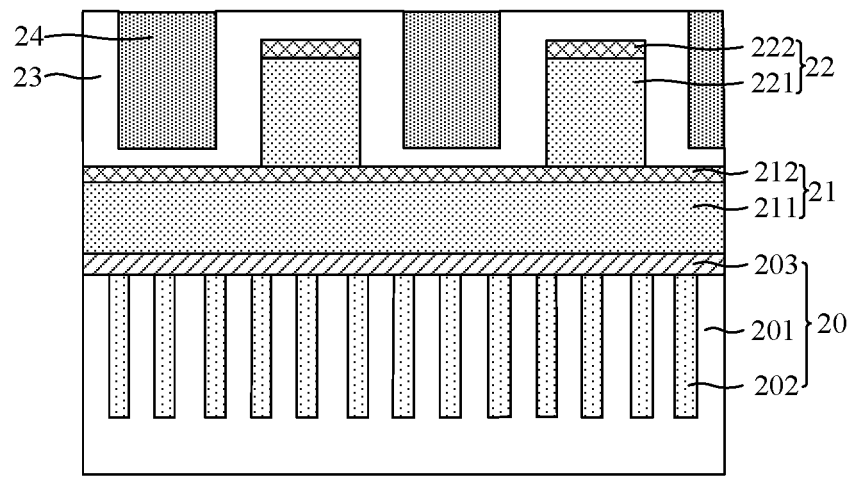
Figure 24:
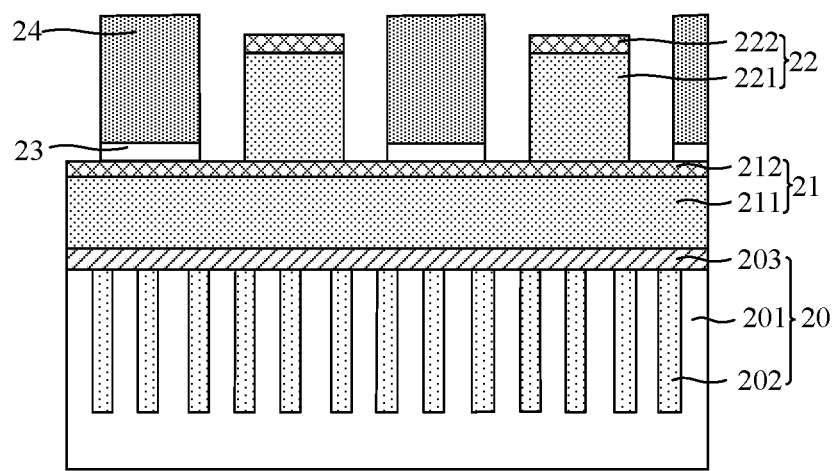

Another embodiment of the disclosure provides a method for manufacturing a semiconductor structure, which is substantially the same as the above embodiment, and the main difference therebetween is that, before the second mask layers are formed, the spacer layers are also arranged on the top surfaces of the first mask layers and on a portion of the substrate between two adjacent first mask layers. Parts of this embodiment of the disclosure that are the same as or similar to the above embodiment are referred to in the detailed description of the above embodiment, which are not repeated herein. FIG. 22-FIG. 24 are schematic diagrams showing structures corresponding to various operations in a method for manufacturing a semiconductor structure according to an embodiment of the disclosure, and detailed description will be made below with reference to the drawings.

Referring to FIG. 22, a substrate 20 is provided. The substrate 20 includes a plurality of active areas 201 separated from each other. The active areas 201 extend along a first direction, and each active area 201 includes a bit line contact area and two electrical connection areas located on both sides of the bit line contact area. An isolation structure 202 is further arranged between two adjacent active areas 201, and the isolation structure 202 and each active area 201 are further covered by a layer of insulating layer 203. The detailed description regarding to the substrate 20 and the active areas 201 refers to the above embodiment.

First mask layers 22 which are separated from each other are formed on the substrate 20. Each first mask layer 22 is in the form of a double-layer structure and includes a first lower layer structure 221 and a first upper layer structure 222 stacked onto one another. Each first mask layer 22 extends along a second direction and spans the plurality of active areas 201. The second direction is different from the first direction. One of the two electrical connection areas of each active area 101 directly faces a respective one of the first mask layers 22.

In the embodiment of the disclosure, before forming the first mask layers 22, the method further includes the following operation. A bottom mask layer 21 covering the substrate 20 is formed. The first mask layers 22 are arranged on the bottom mask layer 21. The bottom mask layer 21 is in the form of a double-layer structure and includes a first bottom mask layer 211 and a second bottom mask layer 212 stacked onto one another. The material of the first bottom mask layer 211 may be a spin-on hard mask, such as silicon carbide, and the material of the second bottom mask layer 212 may be silicon nitride. In other embodiments, the bottom mask layer covering the substrate may also not be formed. It is also possible to form only a bottom mask layer in the form of a single-layer structure.

Spacer layers 23 are formed on two opposite side walls of each first mask layer 22. Each spacer layer 23 extends along the second direction and spans the plurality of active areas 201. Each bit line contact area directly faces a respective one of the spacer layers 23. In the embodiment of the disclosure, the spacer layers 23 are also arranged on a portion of the substrate between two adjacent first mask layers 22 and on the top surfaces of the first mask layers 22. That is, compared with the above embodiment, in this embodiment of the disclosure, after an initial spacer layer for conformal coverage is formed, the initial spacer layer is not performed an etching treatment, and the second mask layers subsequently formed are also arranged on the initial spacer layer.

Compared with the above embodiment, in this embodiment of the disclosure, the operation of etching the initial spacer layer is omitted, so that the production process may be simplified, and the production efficiency may be improved.

Referring to FIG. 22-FIG. 23, second mask layers 24 between adjacent first mask layers 22 are formed. The second mask layers 24 are also arranged on the side walls of the spacer layers 23.

The operation that the second mask layers 24 are formed includes the following operation. Referring to FIG. 22, an initial second mask layer 24a is formed. The initial second mask layer 24a is arranged between the adjacent first mask layers 22, and the initial second mask layer 24a also covers the side wall of each spacer layer 23 and a top surface of each spacer layer 23.

Referring to FIG. 23, the initial second mask layer 24a (referring to FIG. 22) is performed a planarization treatment until the top surface of each spacer layer 23 is exposed.

Referring to FIG. 24, the spacer layers 23 between the first mask layers 22 and the second mask layers 24 are removed. During removal of the spacer layers 23 between the first mask layers 22 and the second mask layers 24, the spacer layer 23 on the top surfaces of the first mask layers 22 are also removed.

In the embodiment of the disclosure, the spacer layers 23 arranged on the top surfaces of the first mask layers 22 and the spacer layers 23 between the first mask layers 22 and the second mask layers 24 are removed through a wet etching process. In other embodiments, the spacer layers arranged on the top surfaces of the first mask layers and the spacer layers between the first mask layers and the second mask layers may also be removed through a dry etching process.

Subsequently, the bottom mask layer 21 is etched by using the first mask layers 22 and laminated structures of the second mask layers 24 and the spacer layers 23 as masks, so as to form a patterned bottom mask layer 21. The substrate 20 is etched by using the patterned bottom mask layer 21 as a mask, so as to form a bit line contact hole. After forming the bit line contact hole, the method also include the operations that a bit line filling the bit line contact hole is formed. The bit line extends beyond the top surface of the substrate. For the detailed description of the above operations, reference is made in the first embodiment.

Overall, in the embodiment of the disclosure, before the second mask layers 24 are formed, the spacer layers 23 are also arranged on the top surfaces of the first mask layers 22 and on a portion of the substrate 10 between two adjacent first mask layers 22. That is, in the embodiment of the disclosure, the operation of etching the spacer layers 23 is omitted, so that the production process may be simplified, and the production efficiency may be improved.

Those of ordinary skill in the art may understand that the above embodiments are some embodiments to implement the disclosure. In practical applications, various changes may be made in forms and details without departing from the spirit and scope of the disclosure. Any person skilled in the art may make changes and modifications without departing from the spirit and scope of the disclosure. Therefore, the protection scope of the disclosure should be subject to the scope defined by the appended claims.

The invention claimed is:

1. A method for manufacturing a semiconductor structure, comprising:
   providing a substrate, the substrate comprising a plurality of active areas separated from each other, the active areas extending along a first direction, and each active area comprising a bit line contact area and two electrical connection areas located on both sides of the bit line contact area;
   forming first mask layers, which are separated from each other, on the substrate, each first mask layer extending along a second direction and spanning the plurality of active areas, the second direction being different from the first direction, and one of the two electrical connection areas of each active area directly facing a respective one of the first mask layers;
   forming spacer layers on two opposite side walls of each first mask layer, each spacer layer extending along the second direction and spanning the plurality of active areas, and each bit line contact area directly facing a respective one of the spacer layers;
   forming second mask layers between adjacent first mask layers, the second mask layers covering side walls of the spacer layers, each second mask layer spanning the plurality of active areas, and the other one of the two electrical connection areas of each active area directly facing a respective one of the second mask layers;
   removing the spacer layers between the first mask layers and the second mask layers; and
   etching the substrate by using the first mask layers and the second mask layers as masks to form a bit line contact hole; and
   wherein the spacer layers are arranged on the side walls of the first mask layers before the second mask layers are formed; and
   forming the spacer layers comprises: forming an initial spacer layer for conformal coverage, the initial spacer layer being arranged on a surface of each first mask layer and on a portion of the substrate between two adjacent first mask layers; and performing an etching treatment on the initial spacer layer to reserve a portion of the initial spacer layer arranged on the side walls of the first mask layers to form the spacer layers.

2. The method for manufacturing the semiconductor structure of claim 1, wherein an angle between the first direction and the second direction in a clockwise direction is an acute angle.

3. The method for manufacturing the semiconductor structure of claim 2, wherein the angle between the first direction and the second direction in the clockwise direction is comprised between 35 degrees and 45 degrees.

4. The method for manufacturing the semiconductor structure of claim 1, wherein an angle between the first direction and the second direction in a clockwise direction is an obtuse angle.

5. The method for manufacturing the semiconductor structure of claim 4, wherein the angle between the first direction and the second direction in the clockwise direction is comprised between 135 degrees and 145 degrees.

6. The method for manufacturing the semiconductor structure of claim 1, wherein after the second mask layers are formed, the spacer layers between the first mask layers and the second mask layers are removed through a wet etching process or a dry etching process.

7. The method for manufacturing the semiconductor structure of claim 1, wherein after forming the bit line contact hole, the method further comprises:
   forming a bit line filling the bit line contact hole, the bit line extending beyond a top surface of the substrate.

8. The method for manufacturing the semiconductor structure of claim 7, wherein forming the bit line filling the bit line contact hole comprises: forming an initial bit line contact layer filling the bit line contact hole, the initial bit line contact layer being arranged on the substrate; forming an initial bit line conductive layer and an initial bit line covering layer stacked onto one another on the initial bit line contact layer; and
   performing a patterning treatment on the initial bit line covering layer, the initial bit line conductive layer and the initial bit line contact layer to form a bit line contact layer, a bit line conductive layer and a bit line covering layer, wherein the bit line contact layer, the bit line conductive layer and the bit line covering layer form the bit line.

9. The method for manufacturing the semiconductor structure of claim 1, wherein a width of each first mask layer is the same as a width of each second mask layer in a direction perpendicular to the second direction.

10. The method for manufacturing the semiconductor structure of claim 1, wherein a material of each first mask layer is the same as a material of each second mask layer.

11. The method for manufacturing the semiconductor structure of claim 1, wherein each first mask layer is in a form of a double-layer structure and comprises a first lower layer structure and a first upper layer structure stacked onto one another, and a hardness of the first upper layer structure is greater than a hardness of the first lower layer structure.

12. The method for manufacturing the semiconductor structure of claim 11, wherein the first lower layer structure is a spin-on hard mask layer.

13. The method for manufacturing the semiconductor structure of claim 11, wherein a material of the first upper layer structure comprises silicon nitride.

14. A method for manufacturing a semiconductor structure, comprising:
   providing a substrate, the substrate comprising a plurality of active areas separated from each other, the active areas extending along a first direction, and each active area comprising a bit line contact area and two electrical connection areas located on both sides of the bit line contact area;
   forming first mask layers, which are separated from each other, on the substrate, each first mask layer extending along a second direction and spanning the plurality of active areas, the second direction being different from the first direction, and one of the two electrical connection areas of each active area directly facing a respective one of the first mask layers;
   forming spacer layers on two opposite side walls of each first mask layer, each spacer layer extending along the second direction and spanning the plurality of active areas, and each bit line contact area directly facing a respective one of the spacer layers;
   forming second mask layers between adjacent first mask layers, the second mask layers covering side walls of the spacer layers, each second mask layer spanning the plurality of active areas, and the other one of the two electrical connection areas of each active area directly facing a respective one of the second mask layers;
   removing the spacer layers between the first mask layers and the second mask layers; and
   etching the substrate by using the first mask layers and the second mask layers as masks to form a bit line contact hole; and
   wherein before forming the first mask layers, the method further comprises: forming a bottom mask layer covering the substrate, the first mask layers being arranged on a surface of the bottom mask layer; and
   etching the substrate by using the first mask layers and the second mask layers as masks comprises: etching the bottom mask layer by using the first mask layers and the second mask layers as masks to form a patterned bottom mask layer; and etching the substrate by using the patterned bottom mask layer as a mask to form the bit line contact hole.

15. The method for manufacturing the semiconductor structure of claim 14, wherein after forming the bit line contact hole, the method further comprises:
   forming a bit line filling the bit line contact hole, the bit line extending beyond a top surface of the substrate.

16. A method for manufacturing a semiconductor structure, comprising:
   providing a substrate, the substrate comprising a plurality of active areas separated from each other, the active areas extending along a first direction, and each active area comprising a bit line contact area and two electrical connection areas located on both sides of the bit line contact area;
   forming first mask layers, which are separated from each other, on the substrate, each first mask layer extending along a second direction and spanning the plurality of active areas, the second direction being different from the first direction, and one of the two electrical connection areas of each active area directly facing a respective one of the first mask layers;
   forming spacer layers on two opposite side walls of each first mask layer, each spacer layer extending along the second direction and spanning the plurality of active areas, and each bit line contact area directly facing a respective one of the spacer layers;
   forming second mask layers between adjacent first mask layers, the second mask layers covering side walls of the spacer layers, each second mask layer spanning the plurality of active areas, and the other one of the two electrical connection areas of each active area directly facing a respective one of the second mask layers;
   removing the spacer layers between the first mask layers and the second mask layers; and
   etching the substrate by using the first mask layers and the second mask layers as masks to form a bit line contact hole; and,
   wherein before the second mask layer are formed, the spacer layers are also arranged on top surfaces of the first mask layers and on a portion of the substrate between two adjacent first mask layers; and
   during removal of the spacer layers between the first mask layers and the second mask layers, the spacer layers on the top surfaces of the first mask layers are also removed.

17. The method for manufacturing the semiconductor structure of claim 16, wherein the spacer layers on the top surfaces of the first mask layers and the spacer layers between the first mask layers and the second mask layers are removed through a wet etching process.

18. The method for manufacturing the semiconductor structure of claim 16, wherein forming the second mask layers comprises: forming an initial second mask layer, the initial second mask layer being arranged between adjacent first mask layers and covering the side wall of each spacer layer and a top surface of each spacer layer; and performing a planarization treatment on the initial second mask layer until the top surface of each spacer layer is exposed to form the second mask layers.

19. The method for manufacturing the semiconductor structure of claim 16, wherein after forming the bit line contact hole, the method further comprises:

forming a bit line filling the bit line contact hole, the bit line extending beyond a top surface of the substrate.

20. The method for manufacturing the semiconductor structure of claim 19, wherein forming the bit line filling the bit line contact hole comprises: forming an initial bit line contact layer filling the bit line contact hole, the initial bit line contact layer being arranged on the substrate; forming an initial bit line conductive layer and an initial bit line covering layer stacked onto one another on the initial bit line contact layer; and performing a patterning treatment on the initial bit line covering layer, the initial bit line conductive layer and the initial bit line contact layer to form a bit line contact layer, a bit line conductive layer and a bit line covering layer, wherein the bit line contact layer, the bit line conductive layer and the bit line covering layer form the bit line.

* * * * *